United States Patent
Ito et al.

(10) Patent No.: US 8,703,586 B2
(45) Date of Patent: Apr. 22, 2014

(54) APPARATUS FOR FORMING DEPOSITED FILM AND METHOD FOR FORMING DEPOSITED FILM

(75) Inventors: Norikazu Ito, Higashiomi (JP); Shinichiro Inaba, Higashiomi (JP); Hiroshi Matsui, Higashiomi (JP); Koichiro Niira, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/390,927

(22) PCT Filed: Sep. 24, 2010

(86) PCT No.: PCT/JP2010/066567
§ 371 (c)(1),
(2), (4) Date: Feb. 16, 2012

(87) PCT Pub. No.: WO2011/037190
PCT Pub. Date: Mar. 31, 2011

(65) Prior Publication Data
US 2012/0171849 A1    Jul. 5, 2012

(30) Foreign Application Priority Data
Sep. 25, 2009   (JP) .................................. 2009-220971

(51) Int. Cl.
*H01L 21/205* (2006.01)
*C23C 16/50* (2006.01)

(52) U.S. Cl.
USPC ... 438/478; 156/345.37; 438/485; 118/723 E; 257/E21.092

(58) Field of Classification Search
USPC .......... 156/345.37; 438/485, 478; 118/723 E; 257/E21.092
See application file for complete search history.

(56) References Cited

U.S. PATENT DOCUMENTS

| 5,012,158 A | | 4/1991 | Nakatani et al. |
| 5,017,403 A | * | 5/1991 | Pang et al. ................ 427/576 |
| 5,849,372 A | * | 12/1998 | Annaratone et al. .......... 427/569 |

(Continued)

FOREIGN PATENT DOCUMENTS

| JP | S63-033572 A | 2/1988 |
| JP | H03-239320 A | 10/1991 |

(Continued)

OTHER PUBLICATIONS

Machine Translation of the Foreign Patent Document: JP 2003173980 A, Jun. 2003, Shinraku et al. See translation attached.*

(Continued)

*Primary Examiner* — Colleen Matthews
*Assistant Examiner* — Regan J Rundio
(74) *Attorney, Agent, or Firm* — Procopio, Cory, Hargreaves & Savitch LLP

(57) ABSTRACT

In order to form a high quality film without causing in-plane nonuniformity in film quality, an apparatus for forming deposited film according to an aspect of the present invention includes: a chamber; a first electrode located in the chamber; a second electrode that is located in the chamber with a predetermined spacing from the first electrode and includes a plurality of supply parts configured to supply material gases; an introduction path connected to the supply parts, through which the material gases are introduced; a heater located in the introduction path; and a cooling mechanism configured to cool the second electrode.

9 Claims, 9 Drawing Sheets

(56) References Cited

U.S. PATENT DOCUMENTS

| | | | |
|---|---|---|---|
| 7,506,610 B2 * | 3/2009 | Koshiishi et al. | 118/723 E |
| 2003/0047282 A1 * | 3/2003 | Sago et al. | 156/345.34 |
| 2003/0176011 A1 * | 9/2003 | Niira et al. | 438/96 |
| 2006/0289116 A1 * | 12/2006 | Ohmi et al. | 156/345.41 |
| 2007/0236148 A1 * | 10/2007 | Yamazawa et al. | 315/111.21 |
| 2008/0053614 A1 | 3/2008 | Sago et al. | |
| 2008/0156440 A1 | 7/2008 | Sago et al. | |
| 2009/0065147 A1 * | 3/2009 | Morita | 156/345.35 |
| 2009/0173444 A1 | 7/2009 | Sago et al. | |
| 2010/0323501 A1 * | 12/2010 | Yamazaki et al. | 438/479 |

FOREIGN PATENT DOCUMENTS

| | | |
|---|---|---|
| JP | 2001-313272 A | 11/2001 |
| JP | 2003-124133 A | 4/2003 |
| JP | 2003-158120 A | 5/2003 |
| JP | 2003-173980 A | 6/2003 |
| JP | 2003-273023 A | 9/2003 |
| JP | 2007-250944 A | 9/2007 |

OTHER PUBLICATIONS

Machine Translation of the Foreign Patent Document: JP 2007250944 A, Sep. 2007, Kunii, Masabumi. See translation attached.*

Machine Translation of the Foreign Patent Document: JP 2003173980 A, Jun. 2003, Shinraku et al.*

Machine Translation of the Foreign Patent Document: JP 2007250944 A, Sep. 2007, Kunii, Masabumi.*

International Search Report and Written Opinion dated Dec. 21, 2010, issued for International Application No. PCT/JP2010/066567.

Japanese Office Action dated Sep. 24, 2013 issued for a Japanese counterpart application No. 2011-533047.

* cited by examiner

F I G . 2 A
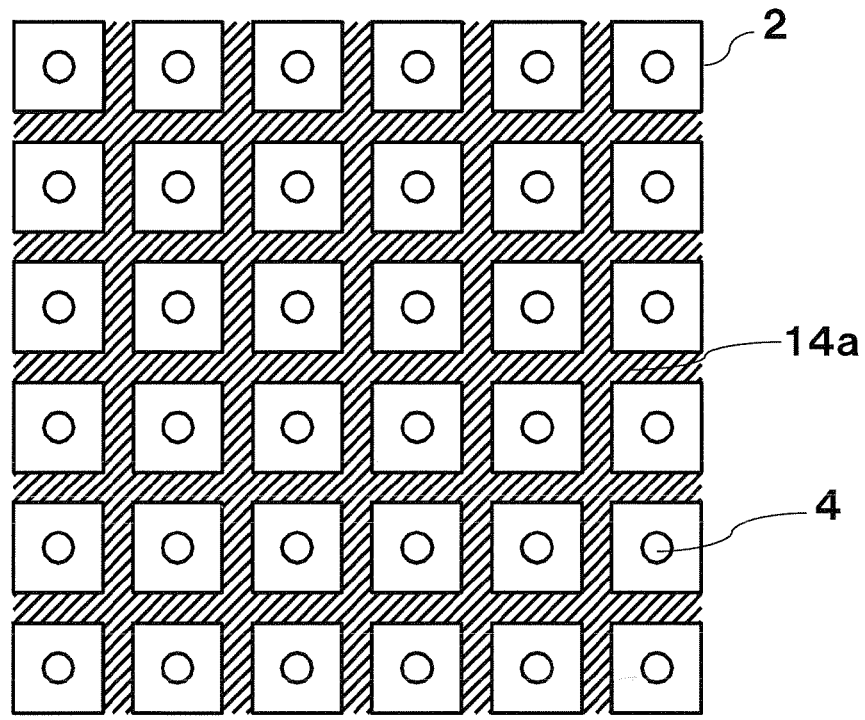
F I G . 2 B
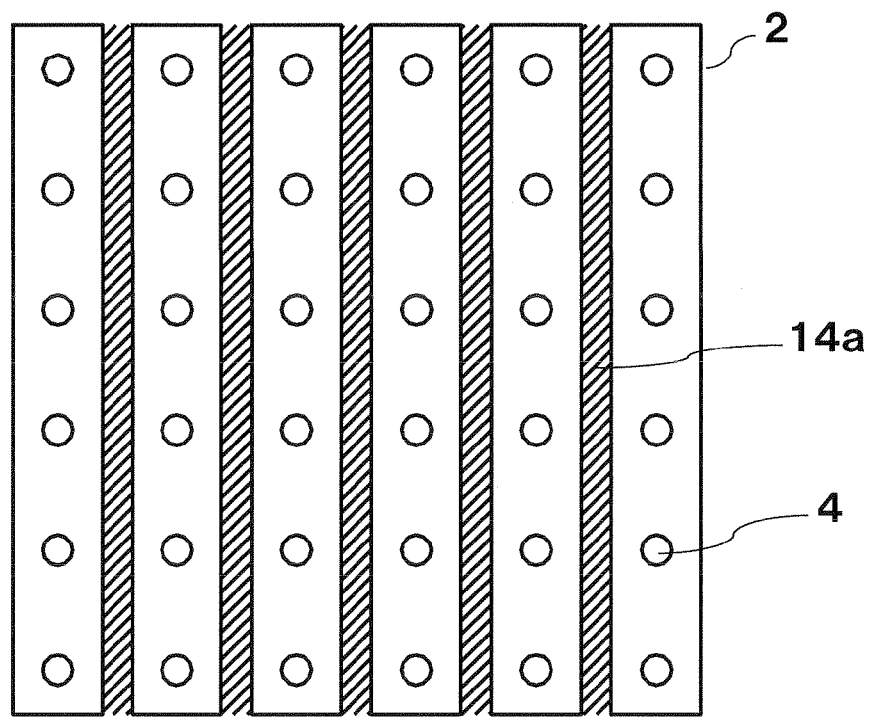

APPARATUS FOR FORMING DEPOSITED FILM AND METHOD FOR FORMING DEPOSITED FILM

TECHNICAL FIELD

The present invention relates to an apparatus and a method for forming, for example, a deposited film of thin film Si on a substrate.

BACKGROUND ART

A conventional apparatus for forming deposited film includes a chamber, a gas introduction path for introducing material gases into the chamber, and a pair of electrodes arranged in the chamber. Further, a substrate on which a deposited film is formed is placed on one of the pair of electrodes. The other of the pair of electrodes is connected with a high-frequency power source for applying high-frequency power to this electrode.

The material gases are decomposed, excited and activated with the applied high-frequency power as dissociation energy in the space sandwiched between the pair of electrodes, to thereby generate various reactive species. Then, a part of those reactive species is deposited on the substrate, to thereby form a film.

An apparatus capable of forming a high quality film at a high speed is desired as the above-mentioned apparatus for forming deposited film. Particularly in a case of a thin film Si-based solar cell, it is desired to form a high quality Si-based thin film at a high speed for reducing the cost of manufacturing solar cells.

Therefore, the applicants have proposed a gas separation-type plasma CVD apparatus containing a heated catalyzer as an apparatus that successfully forms a high quality Si-based thin film at a high speed (for example, see Japanese Patent Application Laid-Open No. 2001-313272).

SUMMARY OF THE INVENTION

Problem to be Solved by the Invention

Unfortunately, as an apparatus increases in size, it is conceivable that an in-plane film quality distribution of a deposited film may become nonuniform in the gas separation-type plasma CVD apparatus containing a heated catalyzer. This mainly results from the fact that the in-plane temperature distribution of a cathode electrode is prone to become nonuniform.

The present invention has an object of providing an apparatus for forming deposited film and a method for forming deposited film capable of forming a high quality film without generating in-plane nonuniformity in film quality, and more particularly, has an object of providing an apparatus for forming deposited film and a method for forming deposited film preferably used for thin film Si-based solar cells.

Means to Solve the Problem

An apparatus for forming deposited film according to an aspect of the present invention includes:
a chamber;
a first electrode located in the chamber;
a second electrode that is located in the chamber with a predetermined spacing from the first electrode and includes a plurality of supply parts configured to supply material gases;
an introduction path connected to the supply parts, through which the material gases are introduced;
a heater located in the introduction path; and
a cooling mechanism configured to cool the second electrode.

A method for forming deposited film according to an aspect of the present invention includes:
a preparation step of preparing a first electrode, a second electrode that is located with a predetermined spacing from the first electrode and includes a first supply part configured to supply a first material gas, a first introduction path connected to the first supply part, through which the first material gas is introduced, a heater provided in the first introduction path, a cooling mechanism configured to cool the second electrode, and a substrate in a chamber;
a substrate disposing step of disposing the substrate between the first electrode and the second electrode;
a gas heating step of heating the first material gas by heat from the heater; and
a discharge generating step of generating a glow discharge with supplying the first material gas between the first electrode and the second electrode,
wherein the discharge generating step is performed between the first electrode and the second electrode under conditions satisfying a following expression:

$$T1 > T2 > T3,$$

where T1 represents a temperature of the first material gas, T2 represents a surface temperature of the second electrode, and T3 represents a surface temperature of the first electrode.

Effects of the Invention

The above-mentioned apparatus for forming deposited film and method for forming deposited film enable to suppress a temperature rise of the second electrode through 1) to 3) below:

1) heat transfer to the second electrode, which results from a temperature rise upon power application to the heating means (radiation and heat conduction through the first material gas);

2) resistive heating of the second electrode itself upon application of high-frequency power to the second electrode; and 3) heat input to the second electrode from an excited plasma.

Through the above, an increase of the substrate temperature can be suppressed. This results in the formation of a deposited film having good film quality. In addition, the in-plane temperature distribution of the second electrode can be made uniform, whereby the in-plane temperature distribution of the substrate is improved, and further, the in-plane temperature distribution of the material gas supplied form the second electrode is improved. Accordingly, a deposited film having good film quality can be formed uniformly. Further, the second electrode is less likely to deform due to a temperature rise, and thus a good film property distribution can be obtained, leading to a longer maintenance cycle of an apparatus. This enables to enhance productivity.

BRIEF DESCRIPTION OF DRAWINGS

FIGS. 2A and 2B schematically shows a structural example of a coolant path in a cooling mechanism used in the apparatus for forming deposited film according to the aspect of the present invention, which are cross-sectional views taken along a line A-A of FIG. 1.

FIG. 3A is a cross-sectional view and FIG. 3B is a perspective view showing a structural example of a coolant path in a cooling mechanism of FIG. 3A.

FIG. 5A is a cross-sectional view and FIG. 5B is a perspective view showing a structural example of a coolant path in a cooling mechanism of FIG. 5A.

EMBODIMENTS FOR CARRYING OUT THE INVENTION

Embodiments of an apparatus for forming deposited film according to an aspect of the present invention are described with reference to the drawings. Redundant descriptions on the same configuration are not given in the respective embodiments.

<Apparatus S1 for Forming Deposited Film>

Figure 1:
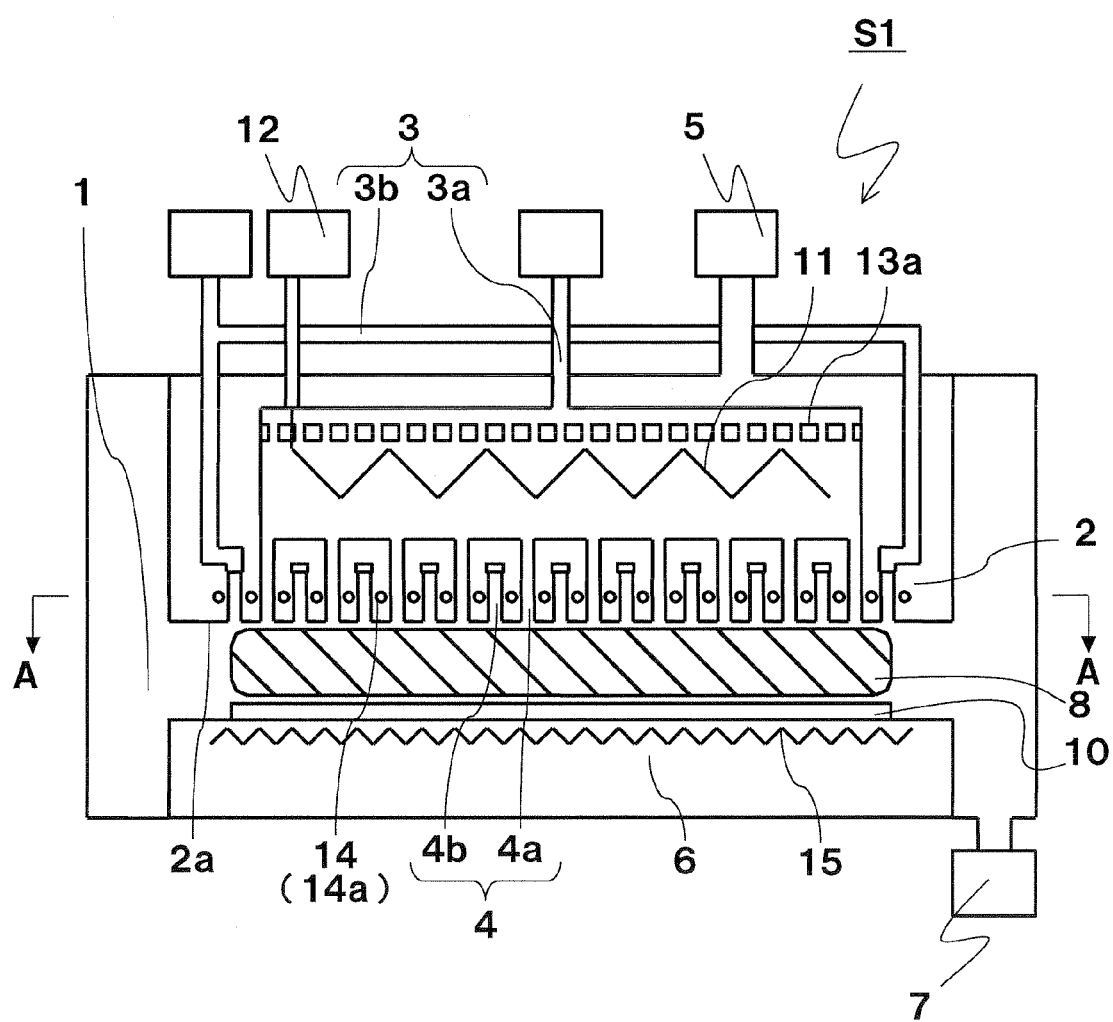
FIG. 1 is a cross-sectional view schematically showing an embodiment of an apparatus for forming deposited film according to an aspect of the present invention.

As shown in FIG. 1, an apparatus S1 for forming deposited film includes a chamber 1, a first electrode 6 located in the chamber 1, a second electrode 2 that is located in the chamber 1 with a predetermined spacing from the first electrode 6 and includes a plurality of supply parts 4 that supply material gases, introduction paths 3 connected to the supply parts 4, through which the material gases are introduced, a heated catalyzer being a heating means 11 provided in the introduction paths 3, and cooling mechanisms 14 that cool the second electrode 2. Here, the first electrode 6 is disposed in the lower portion of the chamber 1, and a substrate 10 is disposed on the first electrode 6. The second electrode 2 disposed to be opposed to the first electrode 6 functions as a shower electrode. It suffices that the substrate 10 is located between the first electrode 6 and the second electrode 2, which is not required to be supported on the first electrode 6 as shown.

The chamber 1 is a reaction vessel with a reaction space that is defined at least by an upper wall, a peripheral wall and a bottom wall and can be vacuum-sealed. The interior of the chamber 1 is evacuated by a vacuum pump 7, and the pressure inside thereof is adjusted by a pressure regulator (not shown).

The first electrode 6 has a function as an anode electrode and contains a substrate heating means (heater) 15 that controls the temperature of the substrate 10 to an appropriate temperature. In this manner, the first electrode 6 also functions as a temperature control mechanism for the substrate 10. Accordingly, the substrate 10 is controlled to, for example, 100 to 400° C., and more preferably 150 to 350° C.

Used as the substrate 10 may be a flat plate comprised of a glass substrate or the like, or may be a film comprised of a metal material, resin or the like.

A high-frequency power source 5 is connected to the second electrode 2, in which a frequency of approximately 13.56 MHz to 100 MHz can be used. In a case of forming a film to have a large area of 1 m$^2$ or more, a frequency of approximately 60 MHz or smaller is preferably used. Upon application of power to the second electrode 2 from the high-frequency power source 5, a plasma is formed in a space 8 between the second electrode 2 and the substrate 10.

The second electrode 2 is disposed to be opposed to the first electrode 6 and functions as a cathode electrode. The second electrode 2 includes the supply parts 4 that supply gases introduced through the plurality of introduction paths 3 into the chamber 1. Those supply parts 4 are open toward the substrate 10.

The plurality of supply parts 4 are coupled with, through the plurality of introduction paths 3, a plurality of gas cylinders (not shown) that store gases different from each other. Basically, the gases introduced through a first introduction path 3a and a second introduction path 3b are not mixed with each other until they reach the space 8 in which a plasma is generated after passing through first supply parts 4a and second supply parts 4b, respectively.

Examples of the gases supplied to the plurality of supply parts 4 include a first material gas and a second material gas that has a higher decomposition probability compared with the first material gas. The total decomposition rate of gas per unit area is proportional to $\exp(-\Delta Ea/kTe) \times Ng \times Ne \times ve \times \sigma g$. Here, $\Delta Ea$ represents the excitation and activation energy (dissociation energy) of material gas, k represents the Boltzmann constant, Te represents an electron temperature, Ng represents a material gas concentration, Ne represents an electron concentration, ye represents an electron speed, and σg represents the collision cross-sectional area of material gas. In addition, $\exp(-\Delta Ea/kTe)$ indicates a decomposition probability. Note that $\exp(-\Delta Ea/kTe) \times \sigma g$ is also expressed as σ (Ea) in some cases. The first material gas is supplied from the first supply parts 4a through the first introduction path 3a. The second material gas is supplied from the second supply parts 4b through the second introduction path 3b. In some cases, the first material gas flowing through the first introduction path 3a is divided and a part thereof is caused to flow through the second introduction path 3b (mixed with the second material gas), as described below.

The heating means 11 connected to a heating power source 12 are provided in the first introduction path 3a. A heated catalyzer, resistive heated material or heated fluid is used as the heating means 11. The first material gas is heated by the heating means 11 heated to 500 to 2,000° C. and is also activated in the space 8 in which a plasma has been generated.

For example, the heated catalyzer functions as a heated catalyzer that increases the temperature through heating by causing a current to flow through a catalyzer, to thereby excite and activate (decompose) the gas in contact therewith. At least the surface of the heated catalyzer is comprised of a metal material. This metal material is preferably and desirably pure metal or an alloy material containing at least one of Ta, W, Re, Os, Ir, Nb, Mo, Ru, and Pt that are refractory metal materials. The heated catalyzer is shaped by, for example, forming the above-mentioned metal material into a wire, a plate or a mesh.

The heated catalyzer is preliminarily heated at a temperature equal to or higher than a heating temperature during the film formation for several minutes or longer, before being used in the film formation. This suppresses doping of impurities contained in the metal material of the heated catalyzer in the film during the film formation. Description is given below of an example in which the heating means 11 is a heated catalyzer.

It is possible to uniformly bring gas into contact with the heating means 11 by providing a first dispersion plate 13a upstream of the heating means 11, which efficiently activates the gas.

The cooling mechanisms 14 that cool the second electrode 2 are included in the vicinity of the supply parts 4 in the second electrode 2. For example, as shown in FIGS. 2A and 2B, the cooling mechanism 14 includes a coolant path 14a through which a cooling medium flows in the second electrode 2. The cooling mechanism 14 is configured such that a fluid such as a silicon oil or a fluorinated oil, or a cooling medium comprised of gas having high heat conductivity such as a hydrogen gas or a helium gas is caused to flow with, for example, a pump provided in a pipy path (not shown) provided outside the chamber 1. The cooling medium is caused to flow through the coolant path 14a in this manner, which makes the temperature distribution of a surface 2a of the second electrode 2 that is opposed to the substrate 10 uniform.

For example, as shown in FIG. 2A, the coolant path 14a may be formed as a lattice-like path almost over the entire surface of the second electrode 2 in a manner of avoiding the supply parts 4 or, as shown in FIG. 2B, may be formed as a plurality of straight paths.

The respective supply parts 4a and 4b may be arranged in various patterns such as lattice pattern and staggered pattern. The number of first supply parts 4a may be different from the number of second supply parts 4b. In a case where the gas flow rate of first material gas is different from the gas flow rate of second material gas, for example, if the gas flow rate of first material gas is larger compared with the second material gas, a supply balance is kept by increasing the number of first supply parts 4a than the number of second supply parts 4b, which enables to form a deposited film having uniform film thickness and film quality.

The introduction path 3 may be connected directly to each cylinder, or the introduction path 3 may be coupled to a gas controller that controls the flow rate, flow speed, temperature or the like of gas.

It is desired to use a dry-system vacuum pump such as a turbo-molecular pump as the vacuum pump 7 for preventing incorporation of impurities from an exhaust system into a film. The ultimate vacuum is at least $1 \times 10^{-3}$ Pa or less, and is preferably $1 \times 10^{-4}$ Pa or less, and the pressure in the film formation is 50 to 7,000 Pa though it varies depending on the type of a film to be formed.

The apparatus S1 for forming deposited film may include a plurality of film forming chambers formed therein. For example, in a case of forming a thin film solar cell element, it suffices that for example, film forming chambers for forming a p-type film, an i-type film and an n-type film are provided and that at least one of the film forming chambers has the above-mentioned structure. In particular, productivity can be enhanced by applying the above-mentioned structure to the film forming chamber for forming an i-type film that requires a film having large thickness and high quality, which enables to form a thin film solar cell having high conversion efficiency.

The first material gas and the second material gas are appropriately selected in accordance with the type of a deposited film. For example, in a case of forming an Si-based thin film comprised of a-Si:H (hydrogenated amorphous silicon) or μc-Si:H (hydrogenated microcrystalline silicon), a non-Si-based gas and an Si-based gas may be used as the first material gas and the second material gas, respectively. A hydrogen ($H_2$) gas or the like is used as the non-Si-based gas. A silane ($SiH_4$) gas, disilane ($Si_2H_6$) gas, silicon tetrafluoride ($SiF_4$) gas, silicon hexafluoride ($Si_2F_6$) gas, dichlorosilane ($SiH_2Cl_2$) gas or the like is used as the Si-based gas. In a case of introducing a doping gas, for example, a diborane ($B_2H_6$) gas is used as a p-type doping gas and a phosphine ($PH_3$) gas is used as an n-type doping gas. Any of the first introduction path 3a and the second introduction path 3b may be selected as the introduction path 3 of the doping gas as desired, and introduction through the second introduction path 3b is desired.

The apparatus S1 for forming deposited film including the above-mentioned configuration can accelerate decomposition of the first material gas by heat from the heating means 11. The temperature has been increased in the first material gas that had not been decomposed or the first material gas recombined after being decomposed, and accordingly gas decomposition is accelerated in the space 8 in which a plasma has been generated. Further, the second material gas is supplied from the second supply parts 4b without coming into contact with the heating means 11 and is excited and activated in the space 8 in which a plasma has been generated. This enables to form a film at a high speed as well as form a high quality thin film without excessively decomposing the second material gas.

In particular, the hydrogen gas (first material gas) whose temperature has been increased by the heating means 11 is supplied to the space 8 in which a plasma has been generated, and thus reaction of higher-order silane formation is suppressed in the space 8 owing to a gas heating effect.

Here, the reaction of higher-order silane formation is the reaction in which polymeric gas is formed by $SiH_2$ insertion reaction expressed below and similar $SiH_2$ insertion reaction thereafter.

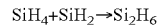

$$SiH_4 + SiH_2 \rightarrow Si_2H_6 \quad \quad 1)$$

$$Si_2H_6 + SiH_2 \rightarrow Si_3H_8 \quad \quad 2)$$

$SiH_2$ is generated together with $SiH_3$ that is the main component of a film to be formed by collision of $SiH_4$ with electron in a plasma. A larger amount of $SiH_2$ is generated as plasma power is increased particularly for increasing a speed of film formation. As a result, more higher-order silane molecules are formed as well.

The thus generated higher-order silane molecules disturb deposition reaction (film growth reaction) on a surface of a film to be formed and degrades the film quality when adhering to the surface of the film to be formed. Further, higher-order silane molecules that have been taken into the film disturb the film structure and degrade the film quality. However, the reaction of higher-order silane formation is suppressed by an action described below in the present embodiment.

The reaction of high-order silane formation has been already recognized as the exothermal reaction. That is, it is the reaction which proceeds by discharging the heat generated through reaction to the space. However, if a space (specifically, space in which gas mainly containing hydrogen gas is present) has been heated by the gas heating effect, the heat of reaction is difficult to be discharged to this space. That is, the reaction of high-order silane formation being exothermal reaction is difficult to proceed. Accordingly, it is possible to form a high quality silicon film even under conditions of high speed film formation with large plasma power.

Through the above, the apparatus S1 for forming deposited film is capable of suppressing a temperature rise of the second electrode 2 through 1) to 3) below:

1) heat transfer (radiation and heat conduction through the first material gas) to the second electrode 2, which results from a temperature rise upon power application to the heating means 11;

2) resistive heating of the second electrode 2 itself upon application of high-frequency power to the second electrode 2; and 3) heat input to the second electrode 2 from an excited plasma.

Through the above, a rise of the substrate temperature can be suppressed. This results in the formation of a deposited film having good film quality. In addition, the in-plane temperature distribution of the second electrode 2 can be made uniform, whereby the in-plane temperature distribution of the substrate 10 is improved. Further, the in-plane temperature distribution of the material gas supplied form the second electrode 2 is improved, and accordingly a deposited film having good film quality can be formed uniformly. Further, the second electrode 2 is less likely to deform due to a temperature rise, and thus a good film property distribution can be obtained. Moreover, a maintenance cycle of an apparatus becomes longer, which enables to enhance productivity.

<Apparatus S2 for Forming Deposited Film>

Figure 3A:
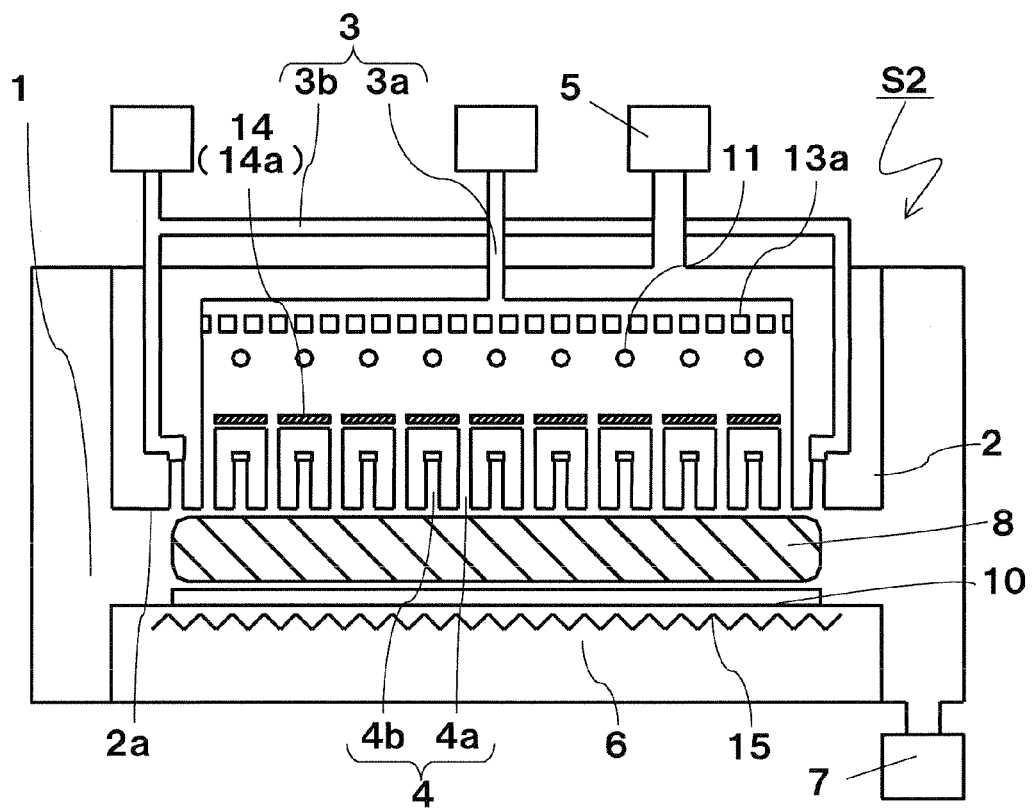
FIGS. 3A and 3B schematically shows another embodiment of the apparatus for forming deposited film according to the aspect of the present invention, where

As an apparatus S2 for forming deposited film shown in FIG. 3A, cooling sheets through which a cooling medium flows may be provided between the second electrode 2 and the heating means 11 as the cooling mechanisms 14. The cooling mechanisms 14 are disposed separately from the second electrode 2 in this manner, which eliminates complicated processing of the second electrode 2. Further, the space that serves as the coolant path 14a does not need to be provided in the electrode, and thus the thermal deformations of the second electrode 2 can be reduced, leading to enhancement of durability when being repeatedly used. It is possible to separately replace the second electrode 2 and the cooling mechanisms 14 in the apparatus maintenance, which enhances maintainability as well as productivity.

Figure 3B:
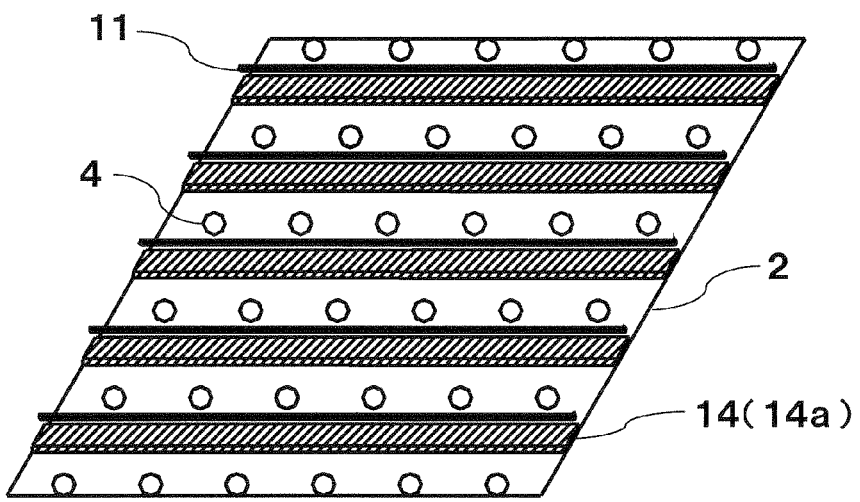

As shown in FIG. 3B, a temperature rise of the second electrode 2 can be suppressed more efficiently by providing the coolant paths 14a through which a cooling medium flows to be parallel with the heating means 11 (with a predetermined spacing).

Similarly to the apparatus S1 for forming deposited film, the coolant paths 14a may be provided in a lattice manner. While the cooling mechanism 14 comprised of a cooling sheet and the second electrode 2 are not necessarily required to come into direct contact with each other, the temperature distribution of the second electrode 2 can be made uniform more efficiently by direct contact therebetween.

A temperature rise of the second electrode 2 can be suppressed by providing the cooling mechanisms 14 as described above, and accordingly tungsten, a nickel-base superalloy or the like having high heat-resistance strength does not need to be used as the second electrode 2, which makes it possible to use stainless steel, aluminum or the like having good processability.

In a case where the cooling mechanisms 14 are provided between the heating means 11 and the second electrode 2, if the cooling mechanism 14 has a function as a reflective plate that reflects the radiation heat of an infrared wavelength irradiated from the heating means 11, a temperature rise of the second electrode 2 and a temperature drop of the heating means are suppressed effectively. As the method therefor, for example, a reflecting surface is subjected to minor surface processing, or the processing of forming a deposited film of Ag, Al, Au or the like is performed such that the reflectance is equal to or higher than 80%, and preferably, 90% or higher.

Preferably used as a cooling medium are fluids such as a silicon oil and a fluorinated oil, or gases having high heat conductivity such as a hydrogen gas and a helium gas, as described above.

The temperature of the cooling medium set to 400° C. or lower reduces a rise of the substrate temperature and improves gas temperature distribution. Further, the temperature of the second electrode 2 set to be higher than the substrate temperature prevents the first material gas decomposed by the heating means 11 from recombining from the excited and activated state.

Cooling media whose temperatures or types are different from each other are caused to flow in the center portion and the peripheral portion of the second electrode 2, which makes the in-plane temperature distribution of the second electrode 2 more uniform.

<Apparatus S3 for Forming Deposited Film>

Figure 4:
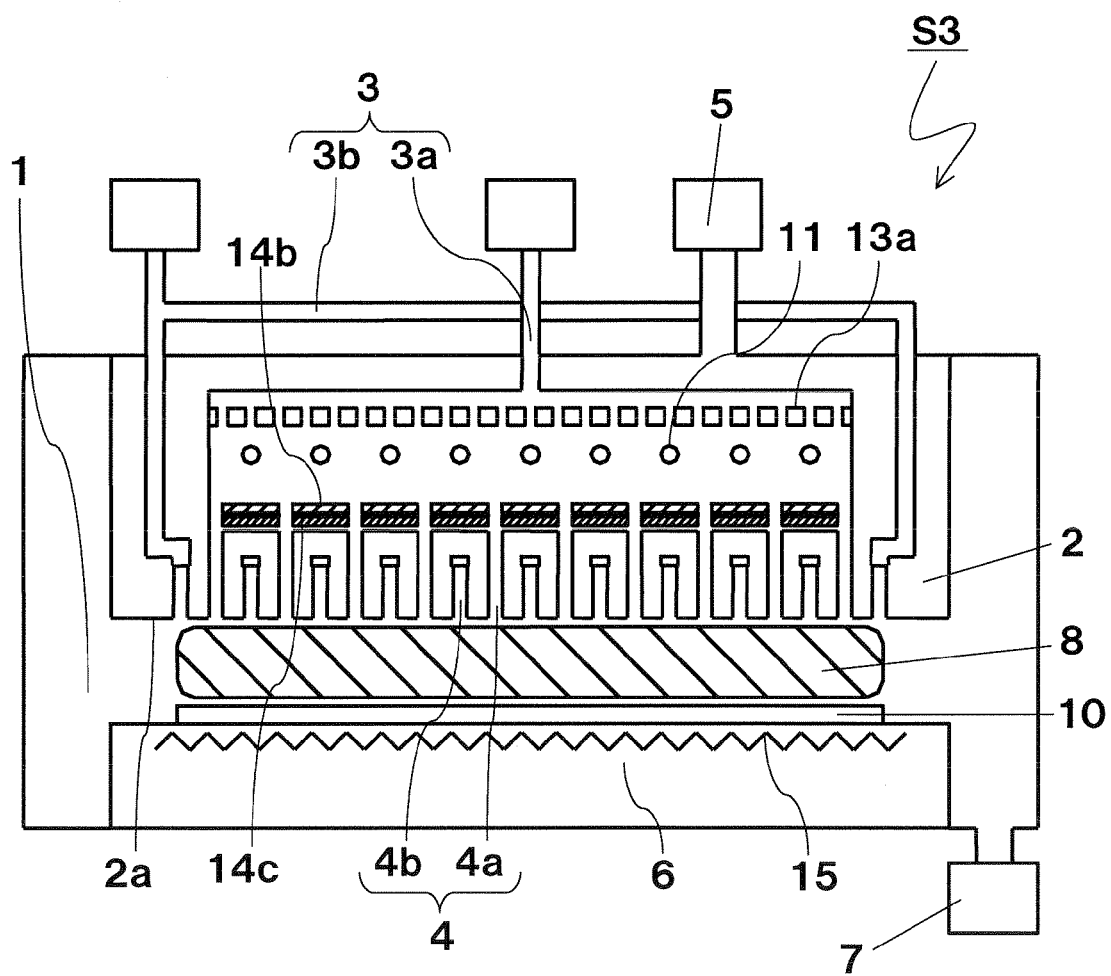
FIG. 4 is a cross-sectional view schematically showing another embodiment of the apparatus for forming deposited film according to the aspect of the present invention.

As an apparatus S3 for forming deposited film shown in FIG. 4, a plurality of coolant paths may be placed in its height direction (thickness direction), to thereby provide, for example, coolant paths 14c and coolant paths 14b positioned thereabove, as shown in the figure. This enables to reduce the temperature of the cooling medium flowing through the coolant path 14b located on the heating means 11 side and increase the temperature of the cooling medium flowing through the coolant path 14c located on the second electrode 2 side. As a result, the heating means 11 side on which the temperature of the cooling mechanism 14 tends to increase can be cooled rapidly, which makes the temperature distribution of the second electrode 2 uniform.

<Apparatus S4 for Forming Deposited Film>

Figure 5A:
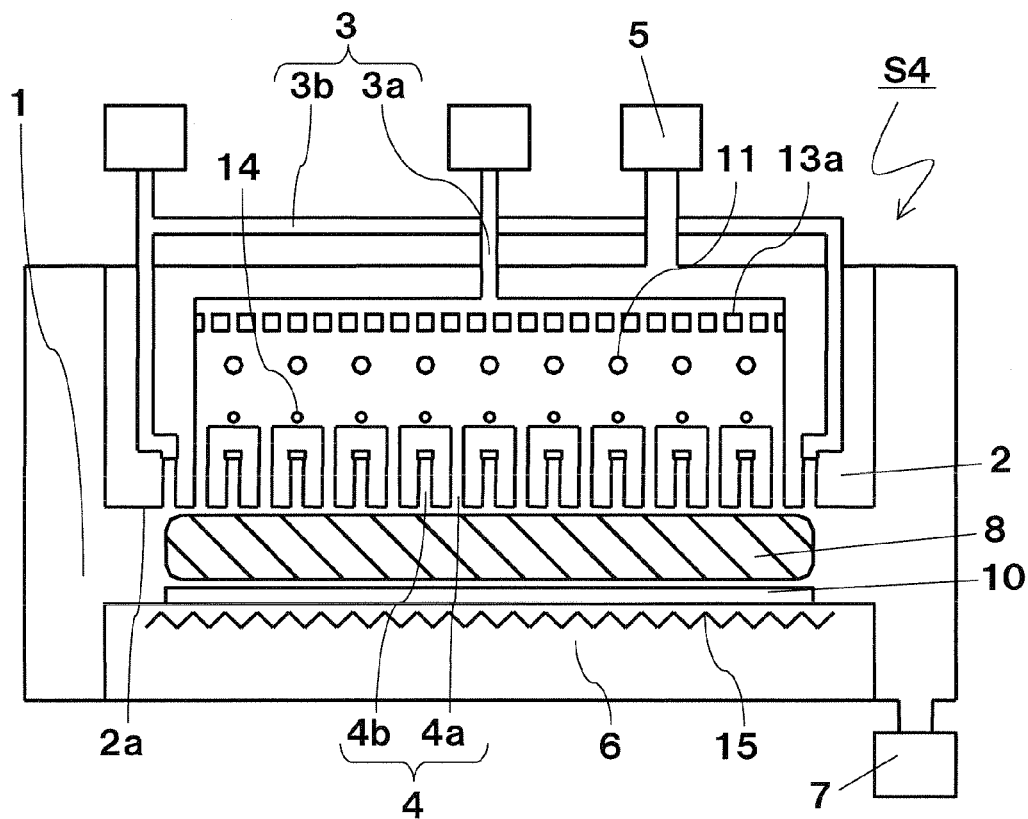
FIGS. 5A and 5B schematically shows another embodiment of the apparatus for forming deposited film according to the aspect of the present invention, where

As an apparatus S4 for forming deposited film as shown in FIG. 5A, heat pipes may be provided between the heating means 11 and the second electrode 2 as the cooling mechanisms 14. The heat pipe refers to one obtained by providing, inside a hollow tube, a working fluid and a capillary tube for rapidly moving the fluid owing to capillarity. With the above-mentioned configuration, a cycle is repeated in which vapors of the working fluid that has evaporated in the high-temperature portion move to the low-temperature portion to be condensed, and the condensed fluid returns to the high-temperature portion via the capillary tube. This enables heat conduction with considerably high efficiency.

While heat pipes are provided between the heating means 11 and the second electrode 2 in the structure of the coolant path in the cooling mechanism 14 shown in FIG. 5A, heat pipes may be provided within the second electrode 2.

Figure 5B:
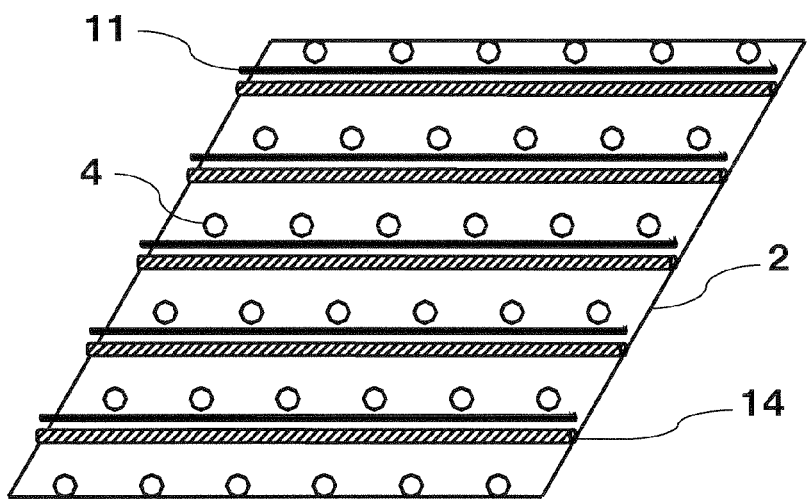

Alternatively, heat pipes are provided in parallel with the heating means 11 as shown in FIG. 5B, which reduces a temperature rise of the second electrode 2 more efficiently.

<Apparatus S5 for Forming Deposited Film>

Figure 6:
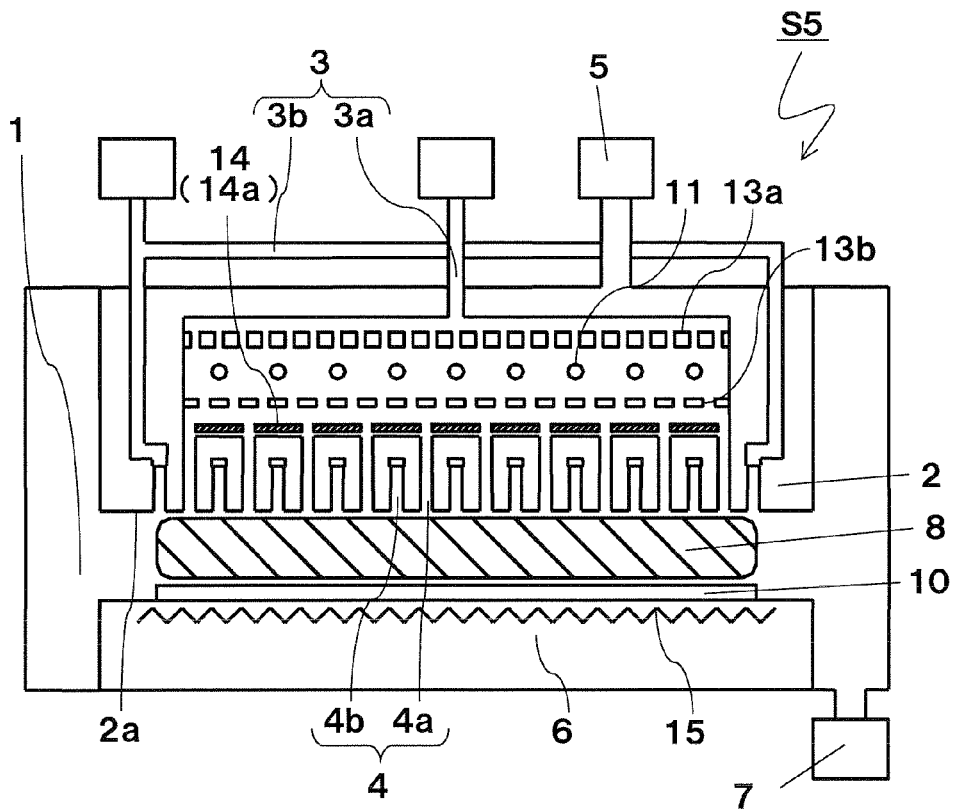
FIG. 6 is a cross-sectional view schematically showing another embodiment of the apparatus for forming deposited film according to the aspect of the present invention.

As an apparatus S5 for forming deposited film shown in FIG. 6, for example, a plate-like second dispersion plate 13b that is comprised of stainless steel and has an opening through which gas passes may be provided downstream of the heating means 11.

Accordingly, the gas that has come into contact with the heating means 11 can be uniformly dispersed into the respective first supply parts. In a case where the cooling mechanisms 14 are provided between the heating means 11 and the second electrode 2, it is possible to reduce the contact of the gas, which has come into contact with the heating means 11, with the cooling mechanism 14. Further, the second dispersion plate 13b has a function as a reflecting plate that reflects the radiation heat of an infrared wavelength irradiated from the heating means 11, which further suppresses a temperature rise of the second electrode 2.

It is preferable to provide the cooling mechanisms 14 and the second dispersion plate 13b, or separately provide a radiation blocking member to prevent the radiation heat irradiated from the heating means 11 from directly reaching the substrate 10. Further, it is preferable to provide the heating means 11 to be located between the first supply parts 4a without providing the heating means 11 directly above the first supply part 4a.

<Apparatus S6 for Forming Deposited Film>

Figure 7:
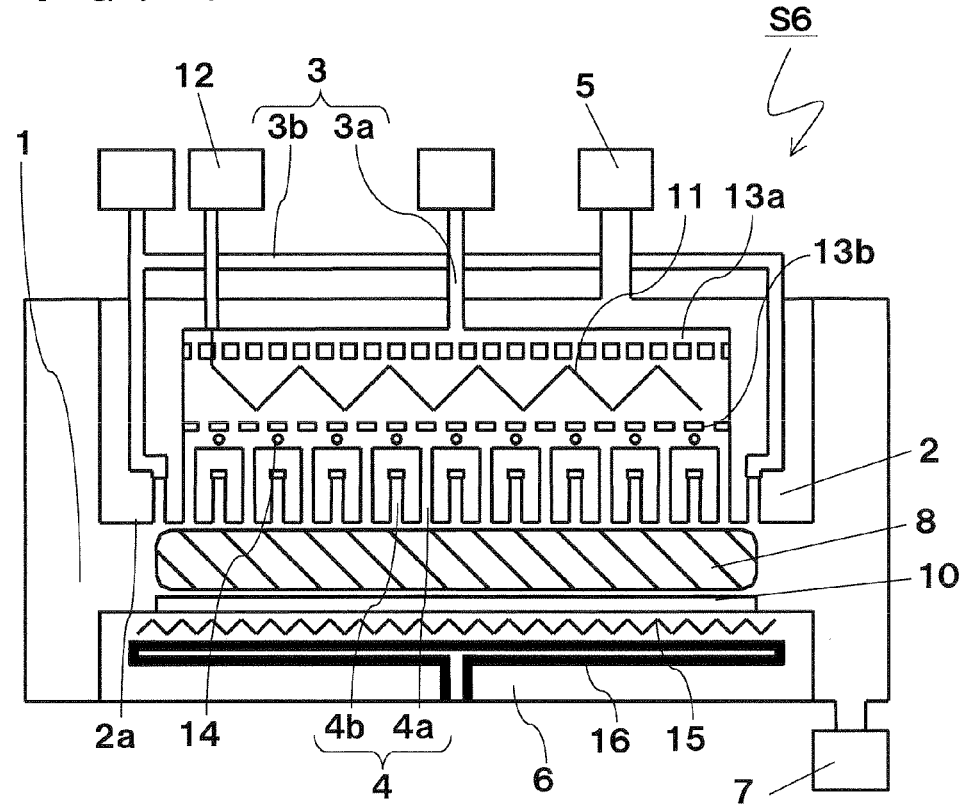
FIG. 7 is a cross-sectional view schematically showing another embodiment of the apparatus for forming deposited film according to the aspect of the present invention.

As an apparatus S6 for forming deposited film shown in FIG. 7, it is desired to provide the above-mentioned path through which a vapor or liquid cooling medium flows inside the first electrode 6, to thereby form substrate-heat removal means 16 that removes the heat of the substrate 10.

A substrate heating means 15 heats the substrate 10 to a predetermined temperature and controls at a good film formation temperature and, in a case of heating by the heating means 11, the first material gas that comes into contact with the heating means 11 is heated, and the first material gas whose temperature has risen comes into contact with the substrate 10. Although the temperature of the substrate 10 rises by heat input from a plasma, the heating means 15 is stopped such that the substrate 10 can be controlled to a predetermined temperature by the substrate-heat removal means 16. This enables to control the entire substrate 10 to a constant temperature, which makes the quality of a deposited film uniform.

Alternatively, an electrostatic chuck may be provided to the first electrode 6. This brings the substrate 10 into close contact with the first electrode 6, whereby the temperature of the substrate 10 can be controlled efficiently.

<Apparatus S7 for Forming Deposited Film>

Figure 8:
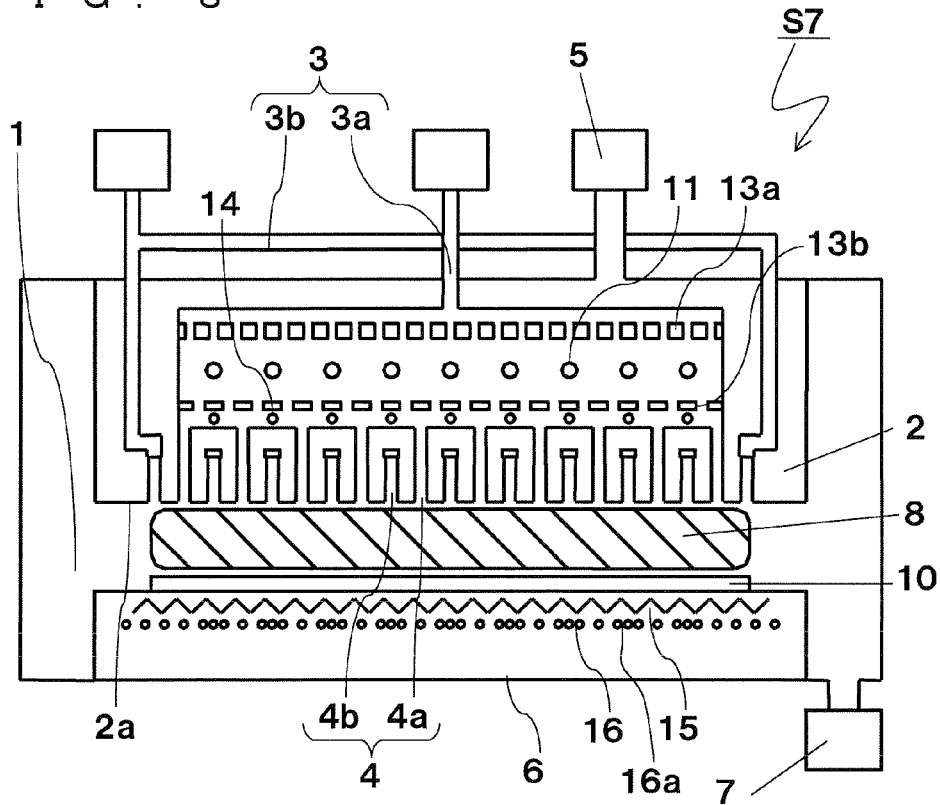
FIG. 8 is a cross-sectional view schematically showing another embodiment of the apparatus for forming deposited film according to the aspect of the present invention.

As an apparatus S7 for forming deposited film shown in FIG. 8, in the substrate-heat removal means 16, coolant paths 16a through which a cooling medium flows are provided more densely directly below the heating means 11 compared with other portion, which uniformly controls the substrate 10 to a predetermined temperature. Alternatively, coolant media whose temperatures or types are different from each other are caused to flow in the portion directly below the heating means 11 and the other portion, whereby the substrate 10 can be uniformly controlled to a predetermined temperature.

<Apparatus S8 for Forming Deposited Film>

Figure 9:
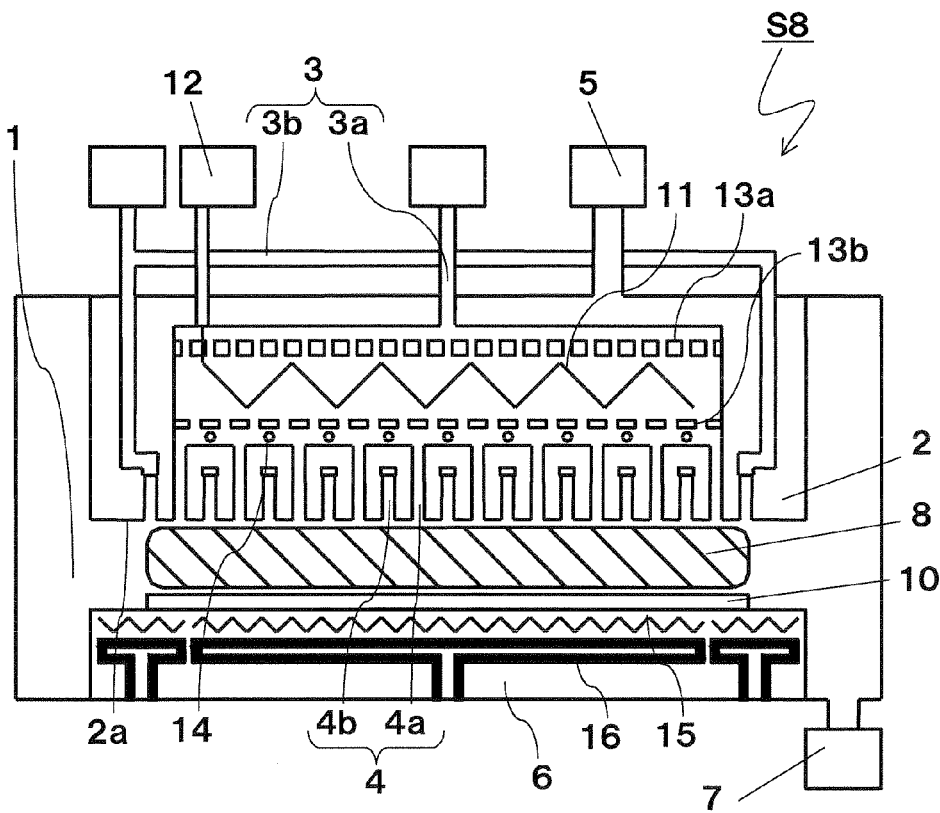
FIG. 9 is a cross-sectional view schematically showing another embodiment of the apparatus for forming deposited film according to the aspect of the present invention.

As an apparatus S8 for forming deposited film shown in FIG. 9, the substrate heating means 15 and the substrate-heat removal means 16 of the first electrode 6 may be individually provided in the center portion and the peripheral portions. This enables to separately control the temperatures of the center portion whose temperature tends to be high and the peripheral portion whose temperature tends to be low, leading to a uniform temperature of the substrate 10.

<Apparatus S9 for Forming Deposited Film>

Figure 10:
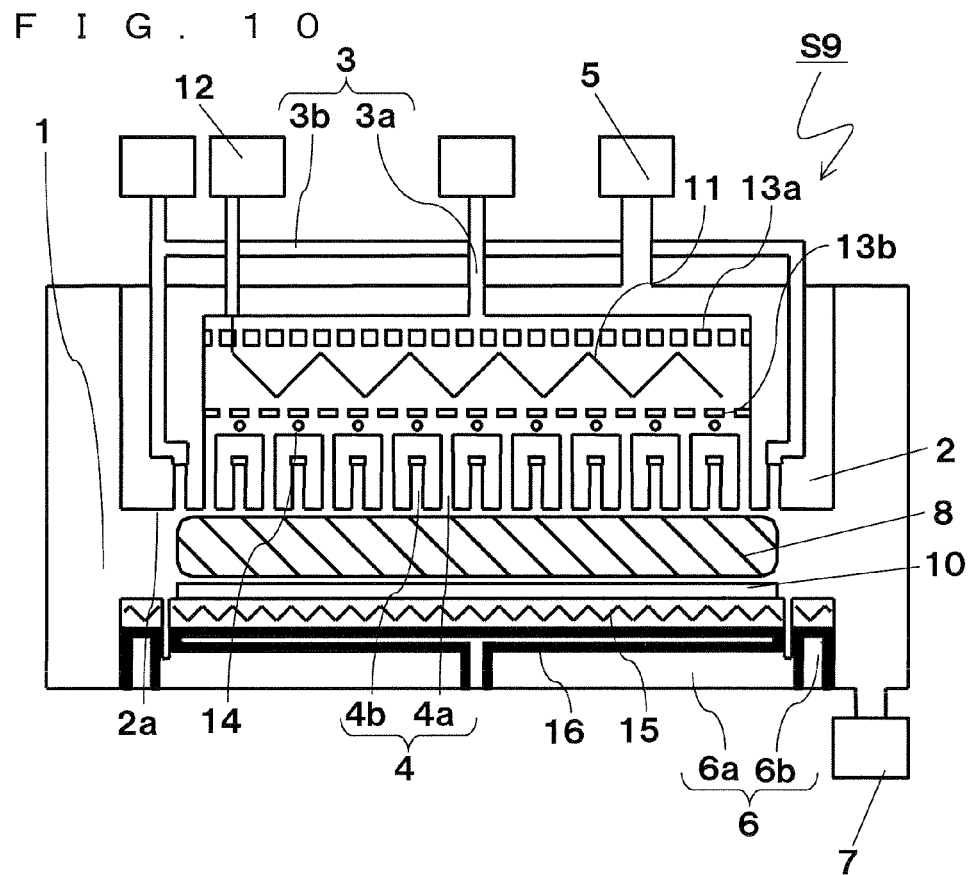
FIG. 10 is a cross-sectional view schematically showing another embodiment of the apparatus for forming deposited film according to the aspect of the present invention.

As an apparatus S9 for forming deposited film shown in FIG. 10, the first electrode 6 may be provided so as to be divided into a substrate-mounting surface 6a and an outer peripheral portion 6b outside the substrate-mounting surface 6a, and the substrate heating means 15 and the substrate-heat removal means 16 may be individually provided to the respective portions, so that the temperature of the outer peripheral portion of the mounting surface is set to be higher than that of the substrate-mounting surface 6a. This makes it difficult for a deposited film to adhere to the outer peripheral portion of the mounting surface while controlling the temperature of the substrate 10 to an optimal value.

<Apparatus S10 for Forming Deposited Film>

Figure 11:
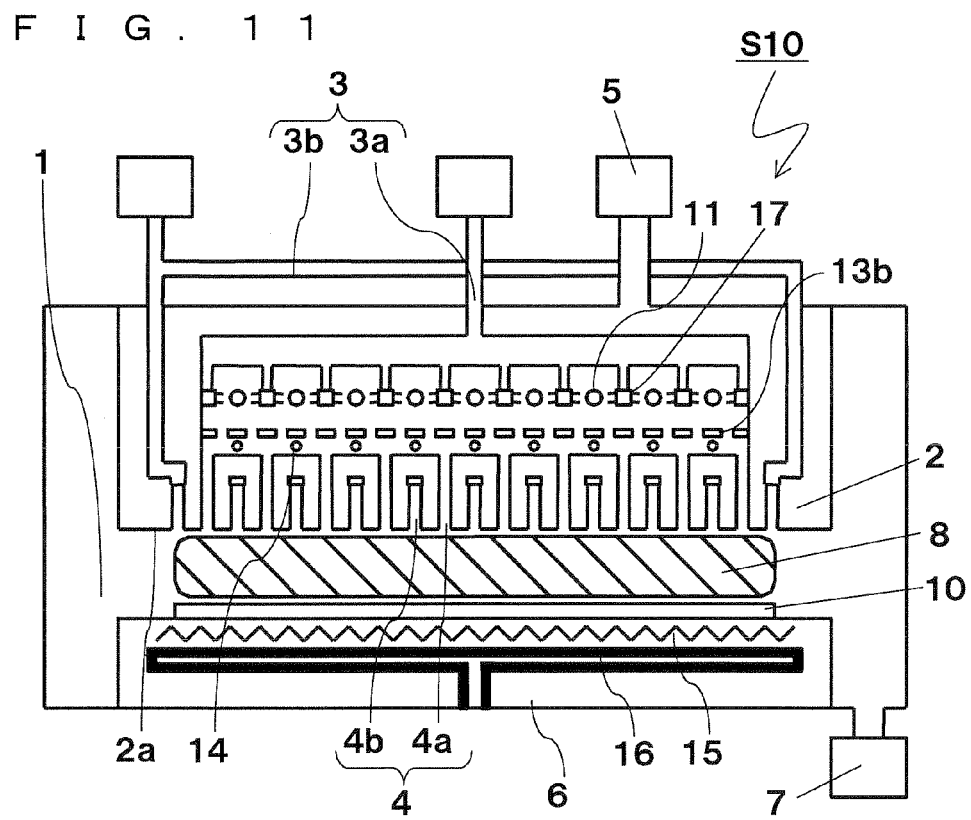
FIG. 11 is a cross-sectional view schematically showing another embodiment of the apparatus for forming deposited film according to the aspect of the present invention.

As an apparatus S10 for forming deposited film shown in FIG. 11, there may be provided a structure 17 that sprays gas onto the heating means 11 extending in one direction (depth direction of the drawing (perpendicular direction to the drawing)) from the sides. This allows the material gas to actively come into contact with the heating means 11, which can activate the material gas efficiently.

<Apparatus S11 for Forming Deposited Film>

Figure 12:
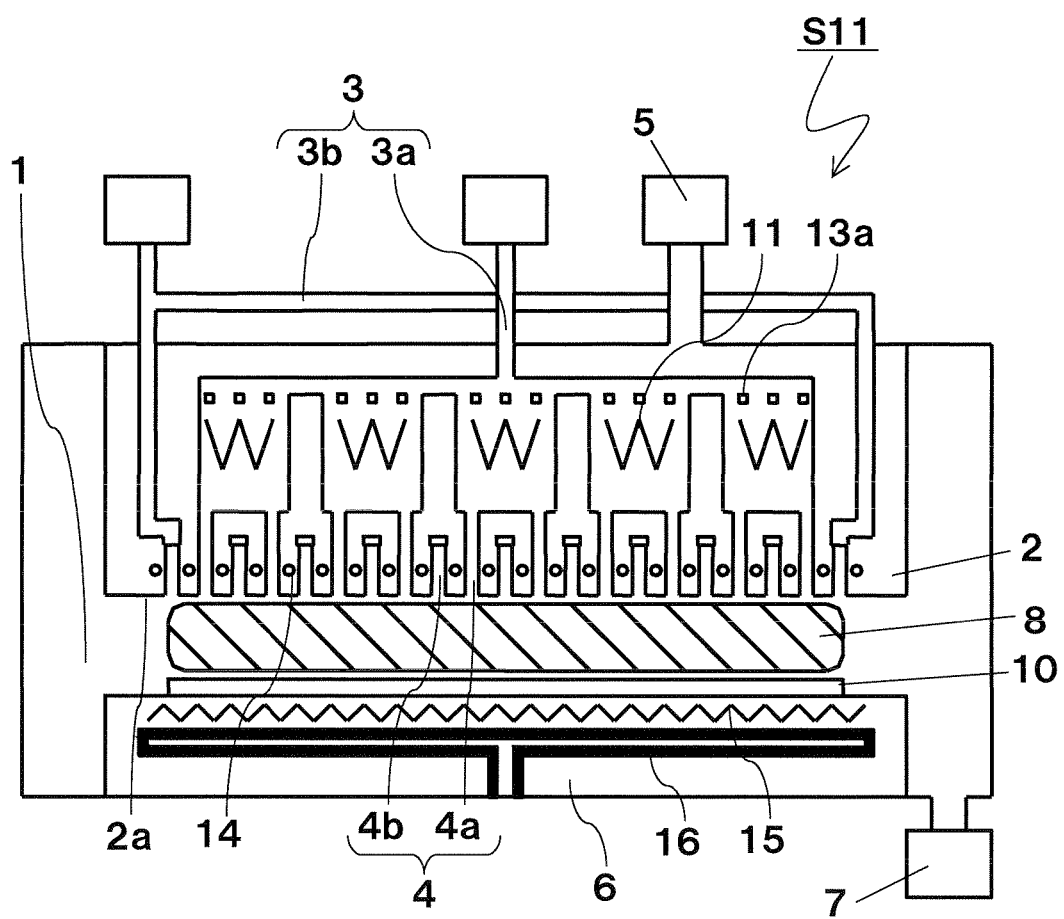
FIG. 12 is a cross-sectional view schematically showing another embodiment of the apparatus for forming deposited film according to the aspect of the present invention.

As an apparatus S11 for forming deposited film shown in FIG. 12, a structure may be made such that the heating means 11 are surrounded and gas remains in those spaces. This allows the material gas to actively come into contact with the heating means 11, which can efficiently activate the material gas. An increased opening diameter of the introduction path on the upstream side of the heating means 11 than the downstream side thereof increases a period of time when gas remains in the space containing the heating means 11, which efficiently activates gas.

While the description has been given of the case where the substrate heating means 15 and the substrate-heat removal means 16 are both provided, the substrate 10 may be controlled by controlling the temperature of a cooling medium of the substrate-heat removal means 16 without providing the substrate heating means 15.

<Method for Forming Deposited Film>

Next, an embodiment of a method for forming deposited film according to an aspect of the present invention is described by mainly taking the apparatus S1 for forming deposited film as an example. Note that the other apparatuses for forming deposited film can form high quality deposited films through steps described below.

Performed first is a preparation step of preparing the first electrode 6, the second electrode 2 that is located with a predetermined spacing from the first electrode 6 and includes the first supply parts 4a configured to supply the first material gas, the first introduction path 3a connected to the first supply parts 4a, through which the first material gas is introduced, the heating means 11 provided in the first introduction path 3a, the cooling mechanisms 14 that cool the second electrode 2, and the substrate 10 in the chamber 1. Next, a substrate disposing step of disposing the substrate 10 between the first electrode 6 and the second electrode 2 is performed. Then, a gas heating step of heating the first material gas by heat from the heating means 11 is performed. Then, a discharge generating step of generating a glow discharge with supplying the first material gas between the first electrode 6 and the second electrode 2 is performed.

Here, the discharge generating step is performed between the first electrode 6 and the second electrode 2 under the conditions of an expression below:

$$T1 > T2 > T3$$

where T1 represents the temperature of the first material gas, T2 represents the surface temperature of the second electrode 2, and T3 represents the surface temperature of the first electrode 6.

Through those steps, components of the material gas are deposited on the substrate 10, to thereby preferably form a deposited film on the substrate 10. Note that in the above-mentioned steps, the substrate 10 is transported by a substrate transport mechanism or the like, and is then supported and held on the first electrode 6.

The first material gas is heated by the heating means 11 in the first supply path 3 and is supplied only from the first supply parts 4a, whereby the first material gas heated by the heating means 11 is supplied to the space 8 in which a plasma is generated. Accordingly, the reaction of higher-order silane generation in the space 8 is suppressed by a gas heating effect.

In a case of forming a hydrogenated amorphous silicon film, it suffices that an $H_2$ gas and an $SiH_4$ gas are supplied to the first introduction path 3a and the second introduction path 3b, respectively, so that a gas pressure is set to 50 to 700 Pa, the $H_2/SiH_4$ ratio is set to 2/1 to 20/1, and a high-frequency power density is set to 0.02 to 0.2 W/cm$^2$. In a case of a thin film solar cell with a pin junction including an i-type amorphous silicon film, it suffices that the i-type amorphous silicon film is formed to have a thickness of 0.1 to 0.5 μm, and preferably 0.15 to 0.3 μm.

In a case of forming a hydrogenated microcrystalline silicon film, it suffices that an $H_2$ gas and an $SiH_4$ gas are supplied to the first introducing path 3a and the second introduction path 3b, respectively, so that a gas pressure is set to 100 to 7,000 Pa, an $H_2/SiH_4$ ratio is set to 10/1 to 60/1, and a high-frequency power density is set to 0.1 to 1 W/cm$^2$. In a case of a thin film solar cell with a pin junction including an i-type microcrystalline silicon film, it suffices that the i-type microcrystalline silicon film is formed to have a thickness of 1 to 4 μm, and preferably 1.5 to 3 μm, and a degree of crystallization of around 70%.

In the method for forming deposited film according to the present embodiment, for example, the second electrode 2 may be cooled by the cooling mechanisms 14, heating by the substrate heating means 15 may be lessened, or heating of the substrate heating means 15 may be stopped after heating the substrate 10 to a predetermined temperature by the substrate heating means 15 and then heating the heating means 11. For example, heat removal is performed by the substrate-heat removal means 16 provided in the apparatus S6 for forming deposited film shown in FIG. 7, which reduces excessive heating of the substrate 10 caused by heat input from the material gas whose temperature has been raised or plasma. Accordingly, the second electrode 2 can be controlled to a predetermined temperature by the cooling mechanism 14, and the substrate 10 can be controlled to a predetermined temperature by the substrate heating means 15 and the substrate-heat removal means 16. Therefore, it is possible to immediately keep the substrate 10 at a predetermined temperature and efficiently control the entire substrate 10 at a uniform temperature. In this manner, it is preferable to control the temperature of the second electrode 2 to a predetermined temperature, and further, control the substrate 10 to a predetermined temperature, to thereby form a deposited film on the substrate 10.

It is preferable that the relationship among the temperature of the first material gas, the surface temperature of the second electrode 2, and the surface temperature of the first electrode 6 when the first material gas comprised of a hydrogen gas or the like heated by the heating means 11 is supplied to the space 8 in which a plasma is generated satisfies the temperature T1 of the first material gas>the surface temperature T2 of the second electrode 2>the surface temperature T3 of the first electrode 6. Here, the relationship of the temperature T1 of the first material gas>the surface temperature T2 of the second electrode 2 is achieved owing to a particular structure that the first material gas is heated by the heating means 11.

Owing to the above-mentioned magnitude relationship of temperature, it is possible to further increase an effect of suppressing the generation of high-order silane polymers by a gas heating effect while reducing thermal deformations of the second electrode 2. Further, T2>T3 allows the temperature of the substrate 10 to be easily controlled to the temperature suitable for film formation, and also reduces the consumption of species that contribute to deposition associated with the film formation on the second electrode 2. This makes it possible to effectively form a film on the substrate 10. As a result, it is possible to uniformly form a high quality film on the substrate 10 at a high speed. In order to obtain the above-mentioned effect, it is preferable to set the temperature of the first material gas to 300 to 1,000° C., the temperature of the second electrode 2 to 200 to 500° C., and the temperature of the first electrode 6 to 100 to 400° C.

The second material gas such as an Si-based gas is supplied to the space 8 by the second supply parts 4b without being directly heated by the heating means 11, whereby the temperature T1 of the first material gas is higher than a temperature T4 of the second material gas (T1>T4). Accordingly, excessive decomposition of Si-based gas is reduced, to thereby form a deposited film.

Alternatively, a cleaning gas may be supplied into the chamber 1 after a deposited film may be formed on the substrate 10 and the substrate 10 is discharged from the chamber 1, so that the cleaning gas is decomposed and activated by a plasma to clean the interior of the chamber. Gas including fluorine (F) or chlorine (Cl) in a molecular formula can be used as the cleaning gas.

Further, it is preferable to supply a carrier gas from the first introduction path 3a in which the heating means 11 comprised of a heated catalyzer is provided and supply a cleaning gas from the second introduction path 3b in which the heating means 11 is not provided, which reduces corrosion and degradation of the heating means 11 comprised of a heated catalyzer due to the cleaning gas. A gas containing a hydrogen gas or an inert gas may be used as the carrier gas.

It is preferable to perform cleaning in such a manner that the temperature of the first electrode 6 is made higher compared when a deposited film is formed by, for example, avoiding the use of the substrate-heat removal means 16 or causing a coolant whose temperature is higher compared when a deposited film is formed to flow. Accordingly, it is possible to suppress adhesion of a reaction product generated in cleaning or residual gas after cleaning to a low temperature portion.

EXAMPLES

Example 1

Hereinafter, a comparison was made between the case where the cooling mechanism 14 including a lattice-like coolant path in which a cooling medium was a silicon oil was provided in the second electrode 2 comprised of stainless steel, the case where the cooling mechanism 14 was provided in the second electrode 2 and the substrate-heat removal means 16 including a lattice-like coolant path in which a cooling medium was a silicon oil was provided in the first electrode 6, and the case where none of the cooling mechanism 14 and the substrate-heat removal means 16 was provided.

Prepared as the apparatus for forming deposited film was an apparatus that is comprised of: the second electrode 2 including the first supply parts 4a that supply an $H_2$ gas (first material gas) and the second supply parts 4b that supply an $SiH_4$ gas (second material gas); and the first electrode 6 that is disposed to be opposed to the second electrode 2, supports the substrate 10 on which a deposited film is formed, and includes the substrate heating means 15 heating the substrate 10, in which the heated catalyzer (the heating means 11) comprised of tantalum is provided in the first introduction path 3a connected to the first supply parts 4a.

The case where the cooling mechanism 14 was provided inside the second electrode 2, the case where the cooling mechanism 14 was provided between the second electrode 2 and the heated catalyzer, the case where the cooling mechanism 14 was provided inside the second electrode 2 and the substrate-heat removal means 16 was provided in the first electrode 6, the case where the cooling mechanism 14 was provided between the second electrode 2 and the heated catalyzer and the substrate-heat removal means 16 was provided in the first electrode 6, and the case where the cooling mechanism 14 and the substrate-heat removal means 16 were not provided were given as conditions A, B, C, D and E, respectively.

On those conditions, the temperatures of the center portion and the edge portion of the surface (surface opposed to the space 8) of the second electrode 2 and the temperatures of the center portion and the edge portion of the surface (surface opposed to the space 8) of the substrate 10 were measured with a thermocouple when a deposited film comprised of a hydrogenated microcrystalline silicon film was formed on the substrate 10 comprised of glass. In this case, the setting temperature of the substrate heating means 15 was set to 150° C. and the temperature of the cooling mechanism 14 was set to 300° C., and the cooling mechanism 14 was provided linearly so as to be parallel to the heated catalyzer (with a predetermined spacing).

Table 1 shows the results on the respective conditions.

TABLE 1

| Conditions | Temperature of second electrode (° C.) | | Temperature of substrate (° C.) | |
|---|---|---|---|---|
| | Center portion | Edge portion | Center portion | Edge portion |
| A | 305 | 302 | 162 | 155 |
| B | 325 | 293 | 170 | 152 |
| C | 300 | 298 | 153 | 150 |
| D | 312 | 290 | 155 | 150 |
| E | 453 | 185 | 281 | 169 |

As shown in Table 1, on the conditions A to D, there was barely any difference in temperature between the center portion and the edge portion of the second electrode 2 and temperature between the center portion and the edge portion of the substrate 10, and values close to the setting temperatures were obtained. However, on the condition E of the conventional example, the temperature difference was large between the center portion and the edge portion of the second electrode 2 and the substrate 10 and, in particular, a value higher than the setting value was obtained in the temperature of the substrate 10.

Example 2

On the conditions A to E, a tandem thin film solar cell obtained by forming a photoelectric conversion layer that is comprised of an amorphous silicon film and has a pin junction on the substrate 10 comprised of glass that includes a transparent conductive film on the surface thereof, forming thereon a photoelectric conversion layer that is comprised of a microcrystalline silicon film and has a pin junction, and forming a rear electrode formed thereon was formed, and then comparison was made on power generation efficiency. In this case, the i-type amorphous silicon film was formed to have a thickness of 2,500 Å and the i-type microcrystalline silicon film was formed to have a thickness of 2.8 μm.

A photoelectric conversion layer comprised of an amorphous silicon film and p-type and n-type microcrystalline silicon films were formed with a parallel-plate-type plasma CVD apparatus. An i-type microcrystalline silicon film was formed with an apparatus for forming deposited film, including the heated catalyzer on the above-mentioned conditions.

On the various setting conditions for forming an i-type microcrystalline silicon film, a gas pressure in the chamber was $P_{out}$=1,333 Pa (=10 Torr).

An $SiH_4$ gas was all introduced from the second supply parts 4b into the chamber 1, and an $H_2$ gas was supplied to the first supply parts 4a and the second supply parts 4b in a divided manner, to thereby form an i-type microcrystalline silicon film. Sixteen thin film solar cell elements of 1 cm×1 cm were formed on the substrate 10 comprised of glass of 10 cm×10 cm.

As a result, it was revealed that power generation efficiency in which initial efficiency was approximately 12.0 to 12.5% was obtained with good reproducibility on the conditions A to D, whereas power generation efficiency of approximately 7.5 to 10.2%, which was lower than the value above, was obtained at most on the condition E. A reduction in power generation efficiency on the condition E shows that the defect density of the i-type microcrystalline silicon film was increased by the hydrogen elimination advanced in a film along with an increase of the surface temperature of the substrate 10, leading to degradation of film quality. Further, it can be regarded that nonuniform in-plane distribution of power generation efficiency resulted from unevenness in temperature distribution of the substrate 10.

Based on the above, it was possible to confirm remarkable effects obtained in the case where the cooling mechanism 14 is provided in the second electrode 2, and the substrate-heat removal means 16 is further provided in the first electrode 6.

| Description of Reference Symbols | |
|---|---|
| 1: | chamber |
| 2: | second electrode |
| 3: | introduction path |
| 4: | supply part |
| 4a: | first supply part |
| 4b: | second supply part |
| 6: | first electrode |
| 8: | space |
| 10: | substrate |
| 11: | heating means |
| 14: | cooling mechanism |
| 14a: | coolant path |
| 16: | substrate-heat removal means |
| 16a: | coolant path |

The invention claimed is:

1. An apparatus for forming deposited film, comprising:
a chamber configured to hold a substrate disposed between a first electrode and a second electrode;
the first electrode located in the chamber;
the second electrode located in the chamber with a predetermined spacing from the first electrode, wherein the second electrode includes a first supply part configured to supply a first material gas to the chamber and a second supply part configured to supply a second material gas to the chamber;

a first introduction path connected to the first supply part, through which the first material gas is introduced;

a second introduction path connected to the second supply part, through which the second material gas is introduced;

a heater located in the first introduction path, wherein the heater is configured to heat the first material gas; and a cooling mechanism configured to cool the second electrode and the substrate;

wherein the apparatus is configured to operate under conditions satisfying an expression $T1>T2>T3$, wherein T1 represents a temperature of the first material gas, T2 represents a surface temperature of the second electrode, and T3 represents a surface temperature of the first electrode, and an expression $T1>T4$, wherein T4 represents a temperature of the second material gas.

2. The apparatus for forming deposited film according to claim 1, wherein the cooling mechanism includes a coolant path through which a cooling medium flows inside the second electrode.

3. The apparatus for forming deposited film according to claim 1, wherein the cooling mechanism includes a cooling sheet that is located between the second electrode and the heater and includes a coolant path through which a cooling medium flows.

4. The apparatus for forming deposited film according to claim 1, wherein the cooling mechanism includes a heat pipe.

5. The apparatus for forming deposited film according to claim 2, wherein the coolant path includes a lattice-like path through which the cooling medium flows.

6. The apparatus for forming deposited film according to claim 2, wherein the coolant path includes a plurality of straight paths through which the cooling medium flows.

7. The apparatus for forming deposited film according to claim 1, wherein the first electrode includes a substrate-heat removal portion configured to remove the heat of the substrate disposed between the first electrode and the second electrode.

8. A method for forming deposited film, comprising:

a preparation step of preparing a first electrode, a second electrode that is located with a predetermined spacing from the first electrode and includes a first supply part configured to supply a first material gas, a first introduction path connected to the first supply part, through which the first material gas is introduced, a heater provided in the first introduction path, a cooling mechanism configured to cool the second electrode, and a substrate in a chamber;

a substrate disposing step of disposing the substrate between the first electrode and the second electrode;

a gas heating step of heating the first material gas by heat from the heater; and a discharge generating step of generating a glow discharge with supplying the first material gas between the first electrode and the second electrode and mixing together the first material gas and a second material gas that is different from the first material gas between the first electrode and the second electrode, wherein the discharge generating step is performed under conditions satisfying an expression $T1>T2>T3$, wherein T1 represents a temperature of the first material gas, T2 represents a surface temperature of the second electrode, and T3 represents a surface temperature of the first electrode, and an expression $T1>T4$, wherein T4 represents a temperature of the second material gas.

9. The method for forming deposited film according to claim 8, wherein a hydrogen gas is used as the first material gas.

* * * * *